United States Patent
Nam et al.

(10) Patent No.: US 9,642,246 B2
(45) Date of Patent: May 2, 2017

(54) PRINTED CIRCUIT BOARD AND THE METHOD FOR MANUFACTURING THE SAME

(71) Applicant: LG INNOTEK CO., LTD., Seoul (KR)

(72) Inventors: Myoung Hwa Nam, Seoul (KR); Byeong Ho Kim, Seoul (KR); Yeong Uk Seo, Seoul (KR); Hyun Seok Seo, Seoul (KR); Chang Woo Yoo, Seoul (KR); Sang Myung Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 200 days.

(21) Appl. No.: 14/385,156

(22) PCT Filed: Mar. 14, 2013

(86) PCT No.: PCT/KR2013/002074
§ 371 (c)(1),
(2) Date: Sep. 13, 2014

(87) PCT Pub. No.: WO2013/137668
PCT Pub. Date: Sep. 19, 2013

(65) Prior Publication Data
US 2015/0041184 A1   Feb. 12, 2015

(30) Foreign Application Priority Data
Mar. 14, 2012   (KR) .................. 10-2012-0026044

(51) Int. Cl.
*H05K 1/03* (2006.01)
*H05K 1/11* (2006.01)
(Continued)

(52) U.S. Cl.
CPC ......... *H05K 1/0306* (2013.01); *H05K 1/0296* (2013.01); *H05K 1/115* (2013.01);
(Continued)

(58) Field of Classification Search
CPC ...... H05K 3/4602; H05K 3/465; H05K 1/115; H05K 1/0296; H05K 1/0306;
(Continued)

(56) References Cited

U.S. PATENT DOCUMENTS 6,329,610 B1   12/2001   Takubo et al.
6,388,207 B1 *   5/2002   Figueroa ........... H01L 23/49805
174/261

(Continued)

FOREIGN PATENT DOCUMENTS

CN   1630460 A   6/2005
JP   2004-335655 A   11/2004
(Continued)

OTHER PUBLICATIONS

European Office Action for European Patent Application No. 13760408 which corresponds to the above identified U.S. application.
(Continued)

*Primary Examiner* — Hoa C Nguyen
(74) *Attorney, Agent, or Firm* — LRK Patent Law Firm

(57) ABSTRACT

A printed circuit board includes: a core insulating layer including a glass fiber; a first insulating layer on an upper portion or a lower portion of the core insulating layer, the first insulating layer including a first circuit pattern groove; a first circuit pattern filling the first circuit pattern groove of the first insulating layer; a second insulating layer covering the first circuit pattern and including a second circuit pattern groove at a top surface thereof; and a second circuit pattern filling the second circuit pattern groove of the second insulating layer, wherein the first insulating layer includes a resin material and a filler distributed in the resin material. Accordingly, a total thickness of the PCB can be thinly formed while maintaining the stiffness by separately form- (Continued)

ing a thin insulating layer without a glass fiber for the buried pattern on the core insulating layer.

10 Claims, 5 Drawing Sheets

(51) Int. Cl.
    *H05K 1/00*     (2006.01)
    *H05K 3/46*     (2006.01)
    *H05K 1/02*     (2006.01)

(52) U.S. Cl.
    CPC ........... *H05K 3/4602* (2013.01); *H05K 3/465* (2013.01); *H05K 1/0366* (2013.01); *H05K 1/0373* (2013.01); *H05K 2201/096* (2013.01); *H05K 2201/09563* (2013.01); *H05K 2201/09854* (2013.01)

(58) Field of Classification Search
    CPC ............... H05K 1/0366; H05K 1/0373; H05K 2201/096; H05K 2201/09854; H05K 2201/09563
    See application file for complete search history.

(56) References Cited

U.S. PATENT DOCUMENTS

| | | | |
|---|---|---|---|
| 8,890,001 B2* | 11/2014 | Nejime | H05K 1/036 174/255 |
| 2004/0077124 A1 | 4/2004 | Ogawa | |
| 2004/0124535 A1 | 7/2004 | Chang | |
| 2004/0160751 A1* | 8/2004 | Inagaki | H01L 21/4857 361/763 |
| 2005/0126818 A1 | 6/2005 | Kojima et al. | |
| 2006/0021794 A1* | 2/2006 | Cheng | H05K 3/0032 174/264 |
| 2007/0281464 A1* | 12/2007 | Hsu | H05K 3/465 438/624 |
| 2009/0008136 A1* | 1/2009 | Ikeguchi | H01L 23/5383 174/255 |
| 2009/0205202 A1* | 8/2009 | Tanaka | H01L 24/82 29/834 |
| 2009/0308645 A1 | 12/2009 | Lee et al. | |
| 2010/0187679 A1* | 7/2010 | Hayashi | H01L 21/4853 257/692 |
| 2011/0123808 A1 | 5/2011 | Lee et al. | |
| 2011/0232085 A1* | 9/2011 | Muramatsu | H05K 3/0032 29/852 |
| 2011/0240354 A1 | 10/2011 | Furuhata et al. | |
| 2012/0229990 A1* | 9/2012 | Adachi | H05K 3/4608 361/748 |
| 2012/0304458 A1* | 12/2012 | Yamauchi | H05K 3/0038 29/829 |

FOREIGN PATENT DOCUMENTS

| | | |
|---|---|---|
| JP | 2006-041463 A | 2/2006 |
| JP | 2009-021469 A | 1/2009 |
| KR | 10-0250136 B1 | 3/2000 |
| KR | 10-2004-0052473 A | 6/2004 |
| KR | 10-2009-0130942 A | 12/2009 |
| TW | 200605738 A | 2/2006 |
| TW | 200623997 A | 7/2006 |

OTHER PUBLICATIONS

Search Report for International Application No. PCT/KR2013/002074.

TIPO Office Action for Taiwanese Patent Application No. 102109090 which corresponds to the above identified U.S application.

SIPO Office Action for Chinese Patent Application No. 201380020634.7 which corresponds to the above identified U.S. application.

\* cited by examiner

[Fig. 1]
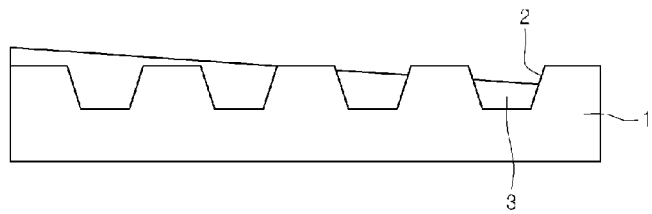
[Fig. 2]
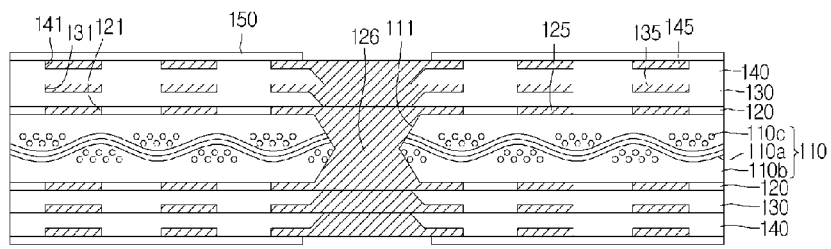
[Fig. 3]
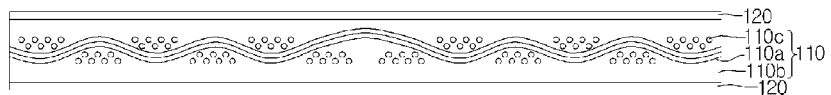
[Fig. 4]
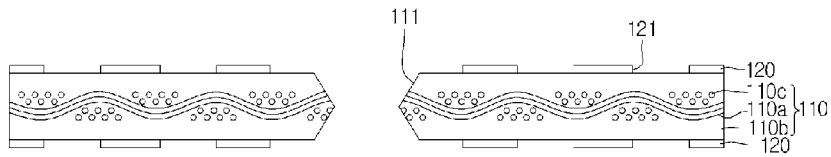
[Fig. 5]
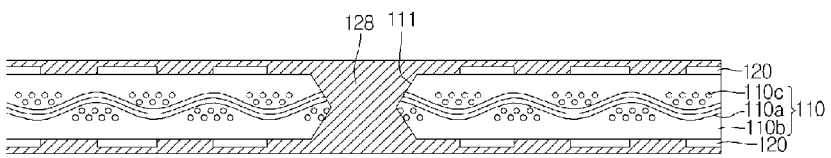
[Fig. 6]
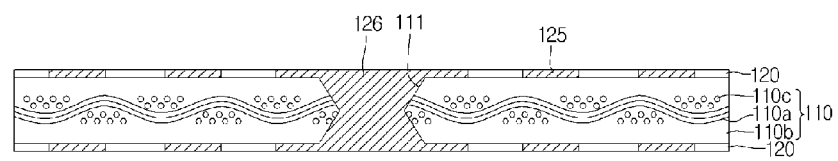
[Fig. 7]
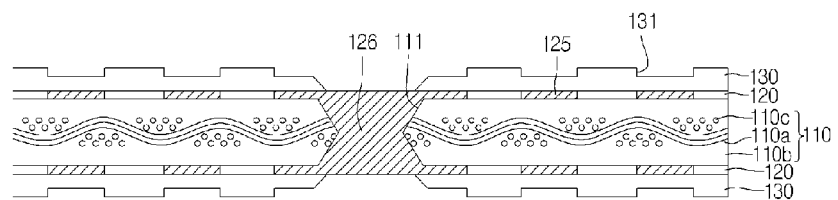

[Fig. 8]
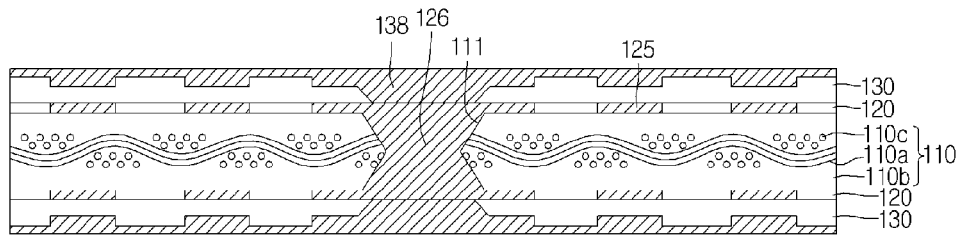
[Fig. 9]
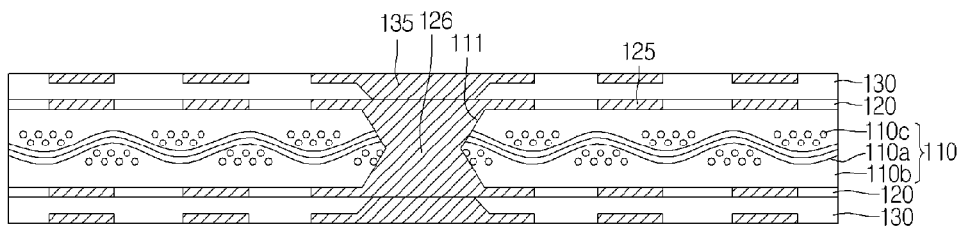
[Fig. 10]
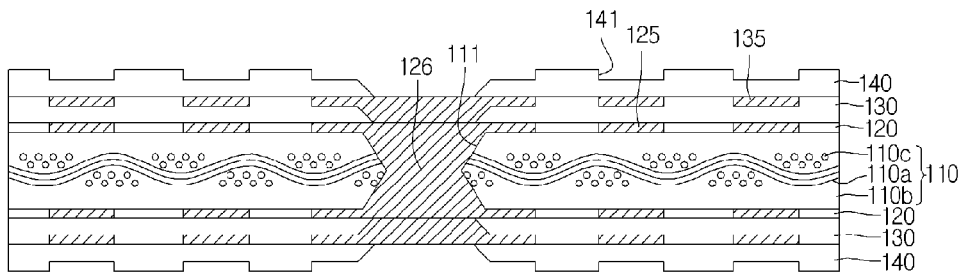
[Fig. 11]
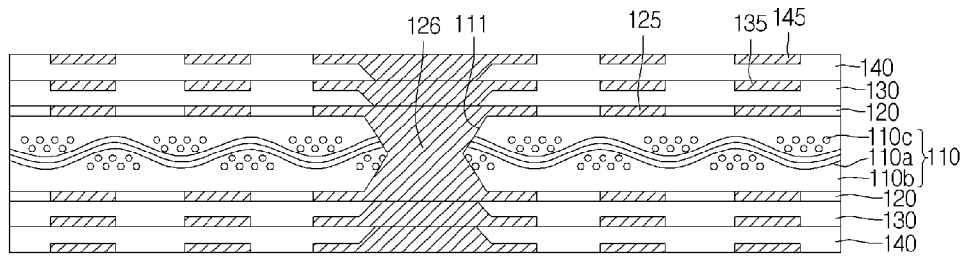
[Fig. 12]
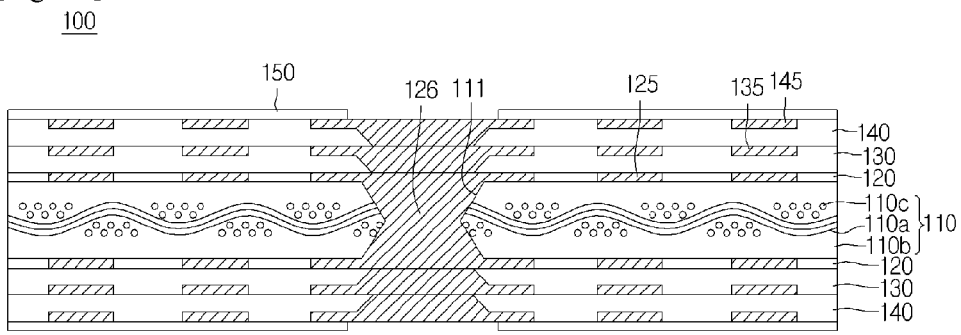

[Fig. 13]
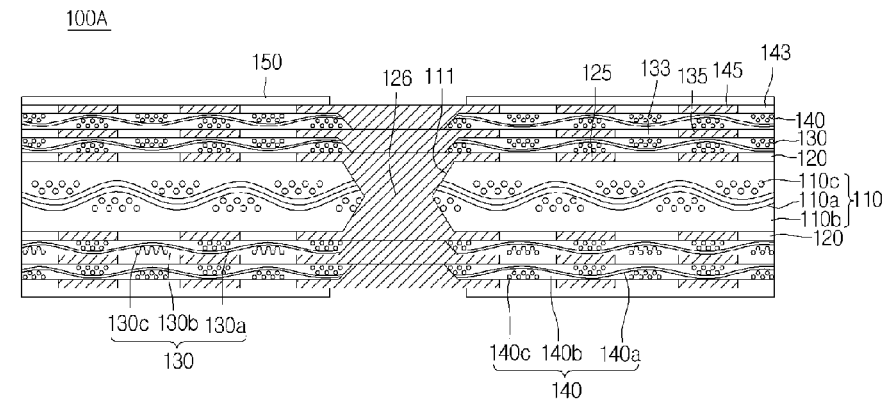
[Fig. 14]
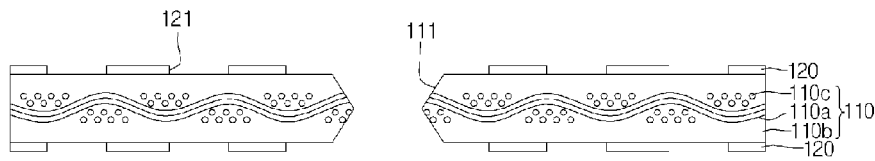
[Fig. 15]
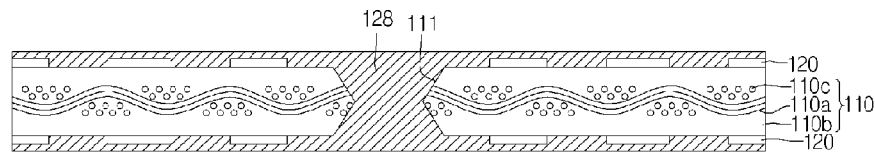
[Fig. 16]
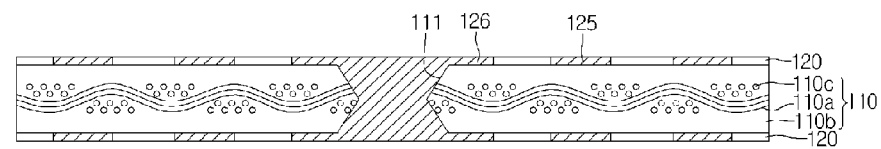
[Fig. 17]
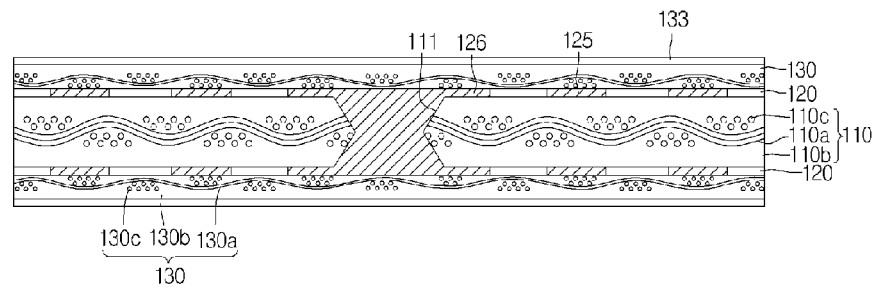
[Fig. 18]
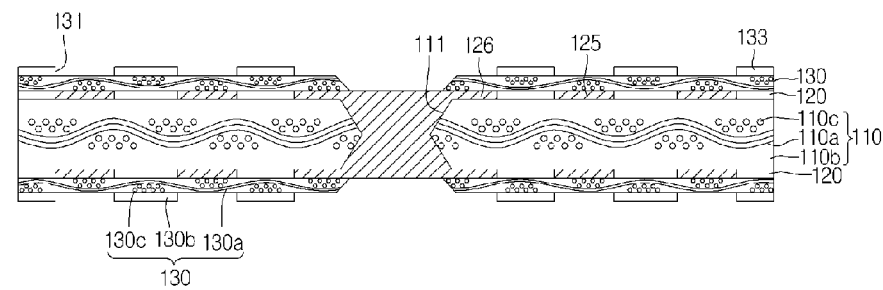

[Fig. 19]
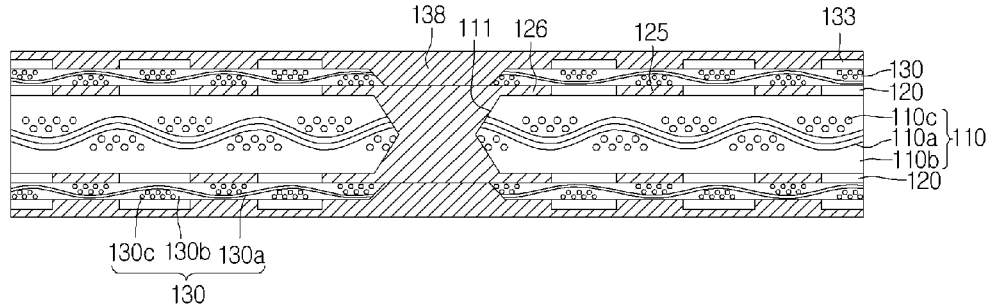
[Fig. 20]
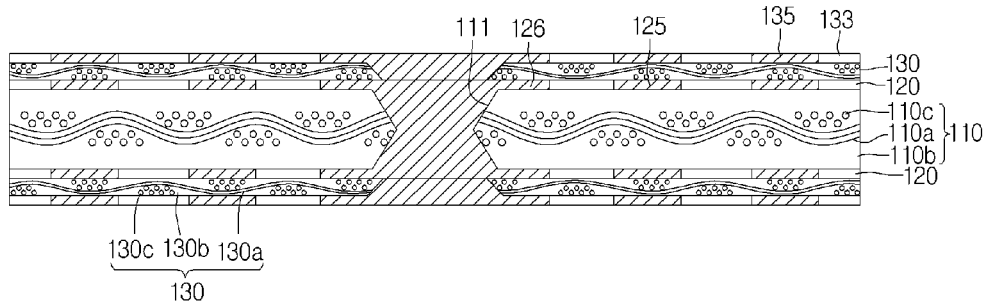
[Fig. 21]
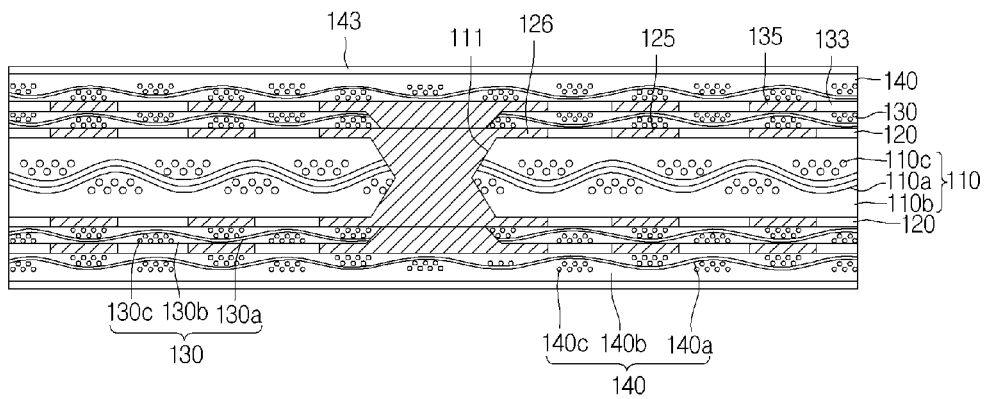
[Fig. 22]
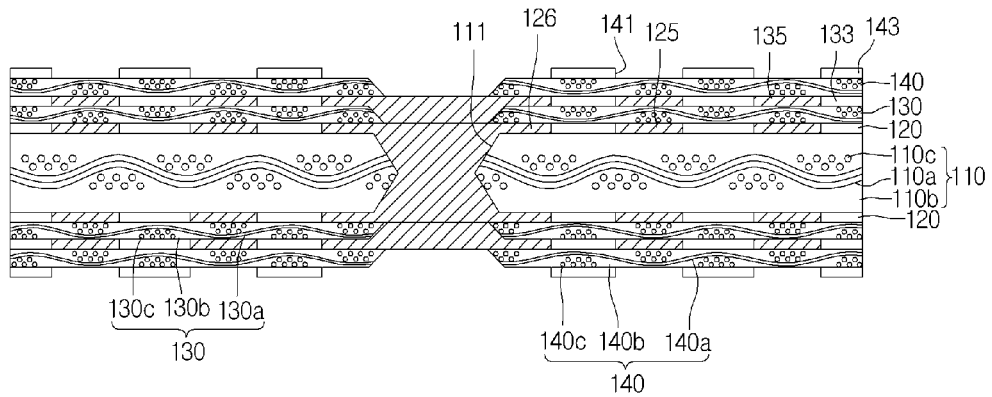

[Fig. 23]
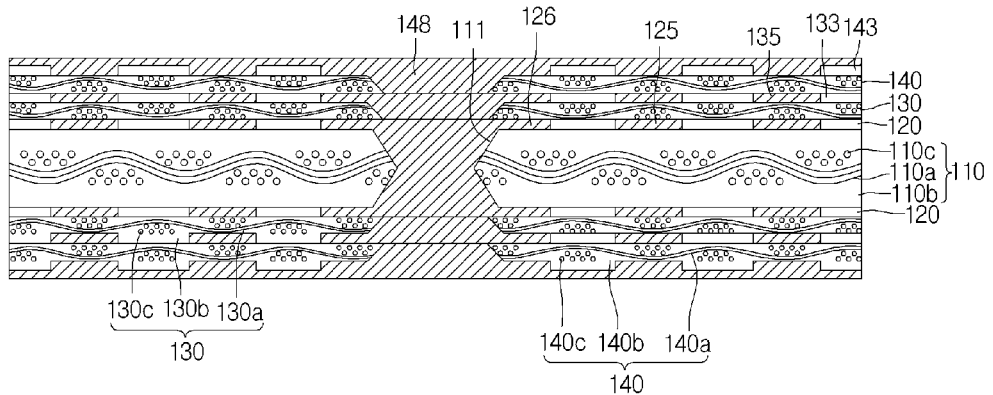
[Fig. 24]
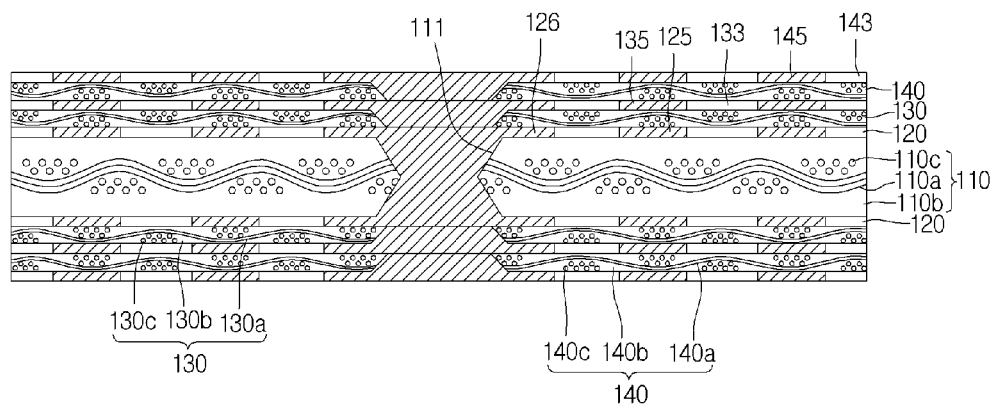
[Fig. 25]
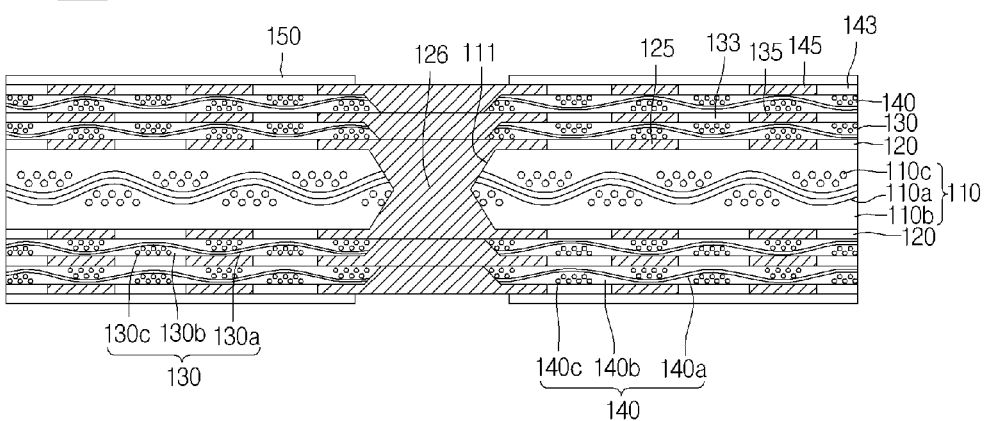

PRINTED CIRCUIT BOARD AND THE METHOD FOR MANUFACTURING THE SAME

TECHNICAL FIELD

The disclosure relates to a printed circuit board and a method for manufacturing the same.

BACKGROUND ART

A printed circuit board (PCB) is formed by printing a circuit line pattern on an electrical insulating substrate by using a conductive material such as copper (Cu), and refers to a board right before electronic parts are mounted thereon. In other words, the PCB refers to a circuit board in which the mounting positions of the electronic parts are determined, and a circuit pattern connecting the electronic parts is fixedly printed on a flat plate in order to densely mount electronic devices on the flat plate.

In the case of the PCB according to the related art, a circuit pattern is formed in a multi-layer configuration according to according to the design of a circuit. In this case, the circuit pattern may protrude upward from an insulating layer by etching a thin copper layer or plating the thin copper layer on the insulating layer.

Accordingly, the other insulating layer is formed on the insulating layer to cover the circuit pattern protruding from the insulating layer, and the other circuit pattern protrudes from the other insulating layer so that a total thickness of the PCB is increased and there is limitation to form a micro-circuit.

Meanwhile, in recent years, a buried pattern substrate having the reduced thickness and planarized surface has been used for the purpose of high performance and miniaturization of electronic parts.

FIG. 1 is a view showing a typical buried pattern PCB 10.

As shown in FIG. 1, the buried pattern PCB 10 includes a buried pattern groove 2 in the surface of an insulating substrate 1 and a circuit pattern 3 formed by filling the buried pattern groove 2 through a plating process.

The PCB 10 having the buried circuit pattern 3 can represent very strong adhesive strength with respect to an insulating member due to the structure of a base circuit pattern and a contact part, and the pitches of base circuit patterns and contact parts can be uniformly and finely formed.

However, when the buried circuit pattern 3 is formed through the plating scheme, plating variation occurs between a region having the pattern groove 2 and a region without the pattern groove 2, so that the etching process may not be uniformly performed after the plating process. Therefore, a predetermined region of the circuit pattern 3 may be not etched as shown in FIG. 1, so that the circuit pattern 3 may be shorted with respect to an adjacent circuit pattern. In addition, another region of the circuit pattern 3 may be over-etched, so that errors may occur in signal transmission.

DISCLOSURE OF INVENTION

Technical Problem

The embodiment provides a printed circuit board having a buried circuit pattern.

The embodiment provides a novel method for manufacturing a buried circuit pattern.

Solution to Problem

According to the embodiment, there is provided a printed circuit board including: a core insulating layer including a glass fiber; a first insulating layer on an upper portion or a lower portion of the core insulating layer, the first insulating layer including a circuit pattern groove; a first circuit pattern filling the circuit pattern groove of the first insulating layer; a second insulating layer covering the first circuit pattern and including a circuit pattern groove at a top surface thereof; and a second pattern filling the circuit pattern groove of the second insulating layer, wherein the first insulating layer including a filler distributed in a resin material.

According to the embodiment, there is provided a method for manufacturing a printed circuit board, the method including: forming a first insulating layer having no glass fiber at an upper portion or a lower portion of a core insulating layer including a glass fiber; forming a first circuit pattern groove in the first insulating layer; forming a plating layer to fill the first circuit pattern groove and to cover a top surface of the first insulating layer through a plating scheme; forming a first circuit pattern by removing the plating layer through chemical mechanical etching until the first insulating layer is exposed; forming a second insulating layer to cover the first buried pattern; and forming a second circuit pattern to fill the second insulating layer.

Advantageous Effects of Invention

According to the embodiment, the micro-buried pattern can be simply formed by removing the plating layer on the insulating layer through the chemical mechanical etching while forming the circuit pattern by filling the groove of the substrate through a plating scheme.

Further, the etching can be performed until the insulating layer is exposed through the chemical mechanical etching without the short between adjacent circuit patterns.

In addition, the buried pattern can be formed while maintaining stiffness by the glass fiber of the core insulating layer by forming the buried pattern in the insulating layer after bonding the insulating layer formed of resin including the filler on the core insulating layer.

As described above, a total thickness of the PCB can be thinly formed while maintaining the stiffness by separately forming a thin insulating layer without a glass fiber for the buried pattern on the core insulating layer.

In addition, since the glass fiber is not included, a laser trench structure is applicable when the groove for the buried pattern is formed so that the PCB can be easily manufactured.

BRIEF DESCRIPTION OF DRAWINGS

FIG. 1 is a sectional view showing a PCB according to the related art.

FIG. 2 is a sectional view showing a PCB according to the embodiment.

FIGS. 3 to 12 are sectional views showing the method for manufacturing the PCB of FIG. 2.

FIG. 13 is a sectional view showing a PCB according to another embodiment.

FIGS. 14 to 25 are sectional views showing the method for manufacturing the PCB of FIG. 13.

BEST MODE FOR CARRYING OUT THE INVENTION

Hereinafter, embodiments will be described in detail with reference to accompanying drawings so that those skilled in the art can easily work with the embodiments. However, the embodiments may have various modifications and may not be limited to the illustrated embodiments.

In the following description, when a predetermined part includes a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, or a plate is referred to as being on or under another layer, another film, another region, or another plate, it can be directly or indirectly on the other layer, film, region, plate, or one or more intervening layers may also be present. Such a position of the layer has been described with reference to the drawings.

The embodiment provides a PCB having a buried circuit pattern to which a thin insulating layer having no glass fiber is attached to form a buried pattern bonded on a core insulating layer including the glass fiber.

Hereinafter, the PCB according to the embodiment will be described with reference to FIGS. 2 to 12.

FIG. 2 is a sectional view showing the PCB according to the embodiment.

Referring to FIG. 2, the PCB 100 according to the embodiment includes a core insulating layer 110, first to third circuit patterns 125, 135, and 145 formed at an upper portion or a lower portion of the core insulating layer 110, and first to third insulating layers 120, 130, and 140 filling the first to third circuit patterns 125, 135, and 145.

The core insulating layer 100 is a substrate impregnated with a glass fiber 110a. In the core insulating layer 110, the glass fiber 110a may be impregnated in a resin material 110b such as an epoxy-based insulating resin, and a filler 110 may be distributed in the resin material 110b.

The filler 110c may be formed in a spherical shape or a bar shape by using $AlO_3$ or $SiO_2$.

The core insulating layer 110 may have a thickness in the range for 90 m to 110 m, and preferably, may have a thickness of 100 m.

The core insulating layer 110 may include via holes 111 formed through the core insulating layer 110.

The via holes 111 are symmetric to each other based on a central region as illustrated in FIG. 2, but the embodiment is not limited thereto.

A conductive via 126 may be formed by filling the via hole 111. The conductive via 126 may include a metallic material such as an alloy including at least one of aluminum (Al), copper (Cu), silver (Ag), platinum (Pt), nickel (Ni), and palladium (Pd).

The core insulating layer 110 is formed thereon or thereunder with a plurality of first circuit patterns 120 serving as a base circuit pattern.

The first circuit pattern 125 may include a material representing high electrical conductivity and low resistance. For example, the first circuit pattern 125 may include a metallic material such as the alloy including at least one of aluminum (Al), copper (Cu), silver (Ag), platinum (Pt), nickel (Ni), and palladium (Pd).

The first circuit pattern 125 may include a single layer or a plurality of layers. When the first circuit pattern 125 is formed through a plating scheme, an electroplating layer may be formed on a seed layer.

The seed layer may include copper (Cu), nickel (Ni), or the alloy thereof. An alloy including at least one of aluminum (Al), copper (Cu), silver (Ag), platinum (Pt), nickel (Ni), and palladium (Pd) is applicable on the seed layer as the electroplating layer.

An expansion part may extend from the conductive via 126 on the core insulating layer 110. The expansion part may be formed at the same height as that of the first circuit pattern 125.

The core insulating layer 110 is formed thereon or thereunder with a first insulating layer 120 surrounding the first circuit pattern 125.

The first insulating layer 120 may include a resin material having no glass fiber, and a filler may be distributed in the resin material. The first insulating layer 120 may include an Ajinomoto build up film (ABF), but the embodiment is not limited thereto.

The first insulating layer 120 inserts the first circuit pattern. The first circuit pattern 125 and the first insulating layer 120 may have the same thickness, and may be fine to satisfy the thickness in the range of 10 m to 20 m.

The first insulating layer 120 includes a first circuit pattern groove 121 exposing the first circuit pattern 125 and an expansion part of the conductive via 126.

As described above, since the first circuit pattern groove 121 is formed only in the first insulating layer 120 without expanding into the core insulating layer 110, the error caused by the glass fiber 110a can be prevented when forming the first circuit pattern groove 121.

A plurality of insulating layers 130 and 140 may be further formed on the first insulating layer 120.

As shown in FIG. 2, the insulating layers 130 and 140 may have two layered structures. A second 130 may be formed on the first insulating layer 120, and a third insulating layer 140 may be formed on the second insulating layer 130.

The second and third insulating layers 130 and 140 may include an insulating layer having no glass fiber, particularly, a resin material with epoxy resin.

The second and third insulating layers 130 and 140 may include the same material, and may be thicker than the first insulating layer 120.

The second and third insulating layers 130 and 140 are formed on top surfaces thereof with a second circuit pattern groove 131 and a third circuit pattern groove 141 and the circuit patterns are filled in the second circuit pattern groove 131 and the third circuit pattern groove 141, respectively.

The second and third circuit pattern grooves 131 and 141 may have the depth the same as that of the first circuit pattern groove 121, and a first insulating layer 120 is not exposed due to the second and third circuit pattern grooves 131 and 141.

Second and third circuit patterns 135 and 145 are formed by filling the second and third circuit pattern grooves 131 and 141, respectively.

The second and third circuit patterns 135 and 145 may have the same thickness as that of the first circuit pattern 125, and may include a via connected to the conductive via 126.

Although FIG. 2 represents a circuit pattern having total six layers of three upper layers and three lower layers based on the core insulating layer 110, the embodiment is not limited thereto.

A solder resist 150 may be further formed to cover the uppermost circuit patterns 145.

The solder resist 150 forms a pad by exposing an expansion part of the uppermost circuit patterns 145 connected to a via.

Hereinafter, a method of manufacturing the PCB 100 of FIG. 2 will be described with reference to FIGS. 3 to 12.

First, as illustrated in FIG. 3, first insulating layers 120 are formed on and under a core insulating layer 110, respectively.

The core insulating layer 100 is substrate impregnated with a glass fiber 110a. The glass fiber 110a is impregnated in a resin material such as an epoxy-based insulating resin, and a filler 110 is distributed in the resin material 110b so that the core insulating layer 110 may be formed.

The first insulating layer 120 may include a resin material into which a glass fiber is not impregnated.

The core insulating layer 110 may have a thickness in the range for 90 m to 110 m, and the first insulating layer 120 may have a thickness of 10 m.

Next, as shown in FIG. 4, a via hole 111 is formed through the core insulating layer 110 and a first circuit pattern groove 121 is formed at a first insulating layer 120.

The via hole 111 can be formed through the glass fiber 110a by using a $CO_2$ laser or a YAG laser. In this case, a process is perform at the upper portion and the lower portion of the core insulating layer 110, so that the via hole 111 symmetrical based on a central portion of the core insulating layer 110 is formed as illustrated in FIG. 4.

That is, the via hole 111 may have a sandglass shape having a width gradually increased toward the top and bottom surfaces from the central portion thereof.

However, when the via hole 11 is formed at one surface of the core insulating layer 110, the via hole 111 has a width gradually reduced from one surface to the other surface or having the same shape.

After that, a first circuit pattern groove 121 is formed at the first insulating layer 120. The first circuit pattern groove 121 may be formed by removing a first insulating layer 120 using an excimer laser. In this case, an expansion part may be formed at a top surface of the via hole 111.

Subsequently, as illustrated in FIG. 5, a plating layer 128 is formed to cover the via hole 111 and the first circuit pattern groove 121.

First, the smear on the surface of the first insulating layer 120 is removed by performing a desmear process.

In detail, after bulging the surface of the first insulating layer 120, the bulged first insulating layer 120 is removed by using permanganate, and a wet etching process is performed to neutralize the first insulating layer 120, thereby removing the smear.

The roughness may be provided on the surface of the first insulating layer 120 through the desmear process.

A seed layer may be formed on the first insulating layer 120 through an electroless plating scheme.

The electroless plating scheme may be performed in the sequence of a degreasing process, a soft etching process, a pre-catalyst process, a catalyst treatment process, an accelerator process, an electroless plating process, and an anti-oxidation treatment process. In addition, the seed layer may be formed by sputtering metallic particles using plasma.

The seed layer includes the alloy including Cu, Ni, Pd, or Cr.

Next, an electroplating process is performed with respect to a conductive material using the seed layer as a seed, thereby forming a plating layer 128.

The plating layer 128 may be formed by performing electroplating process while controlling current according to a plating area.

The plating layer 128 may include Cu representing high electrical conductivity.

Subsequently, as shown in FIG. 6, chemical mechanical etching is performed to remove the plating layer 128 on the first insulating layer 120.

In other words, after placing the PCB 100 on a plate of a polisher, the over-plated plating layer 128 is polished at the basic atmosphere of pH 9 or above. Preferably, the over-plated plating layer 128 is polished by using slurry in which ammonia is added as a main component and peroxide is added in the small quantity.

A polisher rotates on the plate to induce the physical etching for the over-plated plating layer 128 and the slurry.

Accordingly, as shown in FIG. 6, the plating layer 128 is etched until the first insulating layer 120 is exposed through the chemical mechanical etching, so that the plating layer 128 remaining on the first insulating layer 120 is removed so that the polishing is terminated.

The plate may have a diameter of 1200 mm or less. In addition, the plate may be provided with a heat wire so that heat is transferred to the PCB 100. Accordingly, the PCB 100 having the size of 510 410 or larger can be simultaneously etched, so that the plating layer 128 having a large area may be removed.

After that, as illustrated in FIG. 7, a second insulating layer 130 is formed on the first insulating layer 120 to cover the first circuit pattern 125.

The second insulating layer 130 may include epoxy resin, and does not include a separate glass fiber. The second insulating layer 130 may be thinner than the core insulating layer 110 but thicker than the first insulating layer 120.

A second circuit pattern groove 131 is formed by irradiating the excimer laser on the second insulating layer 130.

When forming the second circuit pattern groove 131, because the second insulating layer 130 has no glass fiber, a via hole that opens the expansion part of the via 126 may be formed simultaneously with the second circuit pattern groove 131.

After that, a plating layer 138 is formed by performing a plating process as illustrated in FIG. 8.

A process of forming the plating layer 138 is the same as the process of forming the plating layer 128 of the first circuit pattern 125.

Next, a second circuit pattern 135 of FIG. 9 is formed by performing chemical mechanical etching.

Subsequently, as shown in FIGS. 10 and 11, a third insulating layer 140 and a third circuit pattern 145 are formed.

A process of forming the third insulating layer 140 and the third circuit pattern 145 may be performed by repeating the process of forming the second insulating layer 130 and the second circuit pattern 135.

After that, as shown in FIG. 12, the PCB is manufactured by forming a solder resist 150 which exposes an expansion part of the uppermost layer connected to the via 126 and covers the third circuit pattern 145.

The expansion part of the uppermost layer exposed by the solder resist 150 may be used as a pad.

As described above, since the insulating layer formed with the circuit pattern has no glass fiber while ensuring stiffness of the PCB 100 including the thick core insulating layer 110, formation of the circuit pattern groove is simplified so that the process cost and time can be reduced.

Further, the PCB 100 may be miniaturized by thinly forming the insulating layer.

Hereinafter, another embodiment will be described with reference to FIGS. 13 to 25.

Referring to FIG. 13, the PCB 100A according to the embodiment includes a core insulating layer 110, first to third circuit patterns 125, 135, and 145, first to third insulating layers 120, 130, and 140 formed at an upper portion or a lower portion of the core insulating layer 110.

The core insulating layer 100 is a substrate impregnated with a glass fiber 110a. In the core insulating layer 110, the glass fiber 110a may be impregnated in a resin material 110b such as an epoxy-based insulating resin, and a filler 110 may be distributed in the resin material 110b.

The filler 110c may be formed in a spherical shape or a bar shape by using $AlO_3$ or $SiO_2$.

The core insulating layer 110 may have a thickness in the range for 90 m to 110 m, and preferably, may have a thickness of 100 m.

The core insulating layer 110 may include via holes 111 formed through the core insulating layer 110.

The via holes 111 are symmetric to each other based on a central region as illustrated in FIG. 2, but the embodiment is not limited thereto.

A conductive via 126 may be formed by filling the via hole 111. The conductive via 126 may include a metallic material such as an alloy including at least one of aluminum (Al), copper (Cu), silver (Ag), platinum (Pt), nickel (Ni), and palladium (Pd).

The core insulating layer 110 is formed thereon or thereunder with a plurality of first circuit patterns 120 serving as a base circuit pattern.

The first circuit pattern 125 may include a material representing high electrical conductivity and low resistance. For example, the first circuit pattern 125 may include a metallic material such as the alloy including at least one of aluminum (Al), copper (Cu), silver (Ag), platinum (Pt), nickel (Ni), and palladium (Pd).

The first circuit pattern 125 may include a single layer or a plurality of layers. When the first circuit pattern 125 is formed through a plating scheme, an electroplating layer may be formed on a seed layer.

The seed layer may include copper (Cu), nickel (Ni), or the alloy thereof. An alloy including at least one of aluminum (Al), copper (Cu), silver (Ag), platinum (Pt), nickel (Ni), and palladium (Pd) is applicable on the seed layer as the electroplating layer.

An expansion part may extend from the conductive via 126 on the core insulating layer 110. The expansion part may be formed at the same height as that of the first circuit pattern 125.

The core insulating layer 110 is formed thereon or thereunder with a first insulating layer 120 surrounding the first circuit pattern 125.

The first insulating layer 120 may include a resin material having no glass fiber, and a filler may be distributed in the resin material. The first insulating layer 120 may include an Ajinomoto build up film (ABF), but the embodiment is not limited thereto.

The first insulating layer 120 inserts the first circuit pattern. The first circuit pattern 125 and the first insulating layer 120 may have the same thickness, and may be fine to satisfy the thickness in the range of 10 m to 20 m.

The first insulating layer 120 includes a first circuit pattern groove 121 exposing the first circuit pattern 125 and an expansion part of the conductive via 126.

As described above, since the first circuit pattern groove 121 is formed only in the first insulating layer 120 without expanding into the core insulating layer 110, the error caused by the glass fiber 110a can be prevented when forming the first circuit pattern groove 121.

A plurality of insulating layers 130 and 140 may be further formed on the first insulating layer 120.

As shown in FIG. 2, the insulating layers 130 and 140 may have two layered structures. A second 130 may be formed on the first insulating layer 120, and a third insulating layer 140 may be formed on the second insulating layer 130.

The second and third insulating layers 130 and 140 include glass fibers 130a and 140a, respectively. In the second and third insulating layers 130 and 140, the glass fibers 130a and 140a may be impregnated in resin materials 130b and 140b, and fillers 130c and 140c may be distributed in the resin materials 130b and 140b, respectively.

The second and third insulating layers 130 and 140 may be thinner than the core insulating layer 110 and thicker than the first insulating layer 120.

Second and third circuit patterns 135 and 145 are formed on the second and third insulating layers 130 and 140, and first and second pattern insulating layers 133 and 143 are provided to surround the second and third circuit patterns 135 and 145, respectively.

The first and second pattern insulating layers 133 and 143 may include a resin material having no glass fiber as in the first insulating layer 120, and a filler may be distributed in the resin material. The first and second pattern insulating layer 133 and 143 may include an Ajinomoto build up film (ABF), but the embodiment is not limited thereto.

The first and second pattern insulating layers 133 and 143 are formed on top surfaces thereof with a second circuit pattern groove 131 and a third circuit pattern groove 141 and the circuit patterns are filled in the second circuit pattern groove 131 and the third circuit pattern groove 141, respectively.

The second and third circuit pattern grooves 131 and 141 may have the depth the same as that of the first circuit pattern groove 121, and second and third insulating layers 130 and 140 are not exposed due to the second and third circuit pattern grooves 131 and 141.

Second and third circuit patterns 135 and 145 are formed by filling the second and third circuit pattern grooves 131 and 141, respectively.

The second and third circuit patterns 135 and 145 may have the same thickness as that of the first circuit pattern 125, and may include a via connected to the conductive via 126.

Although FIG. 13 represents a circuit pattern having total six layers of three upper layers and three lower layers based on the core insulating layer 110, the embodiment is not limited thereto.

A solder resist 150 may be further formed to cover the uppermost circuit patterns 145.

The solder resist 150 forms a pad by exposing an expansion part of the uppermost circuit patterns 145 connected to a via.

Hereinafter, a method of manufacturing the PCB 100A of FIG. 13 will be described with reference to FIGS. 14 to 25.

First, as illustrated in FIG. 14, first insulating layers 120 are formed on and under a core insulating layer 110, respectively.

The core insulating layer 100 is substrate impregnated with a glass fiber 110a. The glass fiber 110a is impregnated in a resin material such as an epoxy-based insulating resin, and a filler 110 is distributed in the resin material 110b so that the core insulating layer 110 may be formed.

The first insulating layer 120 may include a resin material into which a glass fiber is not impregnated.

The core insulating layer 110 may have a thickness in the range for 90 m to 110 m, and the first insulating layer 120 may have a thickness of 10 m.

Next, a via hole 111 is formed through the core insulating layer 110 and a first circuit pattern groove 121 is formed at a first insulating layer 120.

The via hole 111 can be formed through the glass fiber 110a by using a $CO_2$ laser or a YAG laser. In this case, a process is perform at the upper portion and the lower portion of the core insulating layer 110, so that the via hole 111 symmetrical based on a central portion of the core insulating layer 110 is formed as illustrated in FIG. 4.

That is, the via hole 111 may have a sandglass shape having a width gradually increased toward the top and bottom surfaces from the central portion thereof.

However, when the via hole 11 is formed at one surface of the core insulating layer 110, the via hole 111 has a width gradually reduced from one surface to the other surface or having the same shape.

After that, a first circuit pattern groove 121 is formed at the first insulating layer 120. The first circuit pattern groove 121 may be formed by removing a first insulating layer 120 using an excimer laser. In this case, an expansion part may be formed at a top surface of the via hole 111.

Subsequently, as illustrated in FIG. 15, a plating layer 128 is formed to cover the via hole 111 and the first circuit pattern groove 121.

First, the smear on the surface of the first insulating layer 120 is removed by performing a desmear process.

In detail, after bulging the surface of the first insulating layer 120, the bulged first insulating layer 120 is removed by using permanganate, and a wet etching process is performed to neutralize the first insulating layer 120, thereby removing the smear.

The roughness may be provided on the surface of the first insulating layer 120 through the desmear process.

A seed layer may be formed on the first insulating layer 120 through an electroless plating scheme.

The electroless plating scheme may be performed in the sequence of a degreasing process, a soft etching process, a pre-catalyst process, a catalyst treatment process, an accelerator process, an electroless plating process, and an anti-oxidation treatment process. In addition, the seed layer may be formed by sputtering metallic particles using plasma.

The seed layer includes the alloy including Cu, Ni, Pd, or Cr.

Next, an electroplating process is performed with respect to a conductive material using the seed layer as a seed, thereby forming a plating layer 128.

The plating layer 128 may be formed by performing electroplating process while controlling current according to a plating area.

The plating layer 128 may include Cu representing high electrical conductivity.

Subsequently, as shown in FIG. 16, chemical mechanical etching is performed to remove the plating layer 128 on the first insulating layer 120.

In other words, after placing the PCB 100 on a plate of a polisher, the over-plated plating layer 128 is polished at the basic atmosphere of pH 9 or above. Preferably, the over-plated plating layer 128 is polished by using slurry in which ammonia is added as a main component and peroxide is added in the small quantity.

A polisher rotates on the plate to induce the physical etching for the over-plated plating layer 128 and the slurry.

Accordingly, as shown in FIG. 6, the plating layer 128 is etched until the first insulating layer 120 is exposed through the chemical mechanical etching, so that the plating layer 128 remaining on the first insulating layer 120 is removed so that the polishing is terminated.

The plate may have a diameter of 1200 mm or less. In addition, the plate may be provided with a heat wire so that heat is transferred to the PCB 100. Accordingly, the PCB 100 having the size of 510 410 or larger can be simultaneously etched, so that the plating layer 128 having a large area may be removed.

After that, as illustrated in FIG. 7, a second insulating layer 130 and a first pattern insulating layer 133 are formed on the first insulating layer 120 to cover the first circuit pattern 125.

The second insulating layer 130 may include a glass fiber, and a first pattern insulating layer 133 may include epoxy resin, and does not include a separate glass fiber. The second insulating layer 130 may be thinner than the core insulating layer 110 but thicker than the first insulating layer 120.

A second circuit pattern groove 131 of FIG. 18 is formed by irradiating the excimer laser on the pattern insulating layer 133.

When forming the second circuit pattern groove 131, because the pattern insulating layer 133 has no glass fiber, a via hole that opens the expansion part of the via 126 may be formed simultaneously with the second circuit pattern groove 131.

After that, a plating layer 138 is formed by performing a plating process as illustrated in FIG. 19.

A process of forming the plating layer 138 is the same as the process of forming the plating layer 128 of the first circuit pattern 125.

Next, a second circuit pattern 135 of FIG. 20 is formed by performing chemical mechanical etching.

Subsequently, as shown in FIGS. 21 and 24, a third insulating layer 140, a second pattern insulating layer 143, and a third circuit pattern 145 are formed.

A process of forming the third insulating layer 140, the second pattern insulating layer 143, and the third circuit pattern 145 may be performed by repeating the process of forming the second insulating layer 130 and the second circuit pattern 135.

After that, as shown in FIG. 25, the PCB is manufactured by forming a solder resist 150 which exposes an expansion part of the uppermost layer connected to the via 126 and covers the third circuit pattern 145.

The expansion part of the uppermost layer exposed by the solder resist 150 may be used as a pad.

As described above, since the insulating layer formed with the circuit pattern has no glass fiber while ensuring stiffness of the PCB 100 including the thick core insulating layer 110, formation of the circuit pattern groove is simplified so that the process cost and time can be reduced.

Further, the PCB 100 may be miniaturized by thinly forming the insulating layer.

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A printed circuit board comprising:
a core insulating layer having a first via hole;
a first via filling the first via hole formed through the core insulating layer;
a first insulating layer on the core insulating layer, the first insulating layer including a first circuit pattern groove;

a first circuit pattern filling the first circuit pattern groove of the first insulating layer;
a second insulating layer on the first insulating layer and having a second via hole;
a second via filling the second via hole formed through the second insulating layer;
a third insulating layer on the second insulating layer, the third insulating layer including a second circuit pattern groove; and
a second circuit pattern filling the second circuit pattern groove of the third insulating layer,
wherein a thickness of the first insulating layer is equal to a thickness of the first circuit pattern,
wherein a thickness of the core insulating layer is equal to a thickness of the first via,
wherein the first insulating layer is thinner in thickness than the core insulating layer,
wherein a thickness of the second insulating layer is equal to a thickness of the second via,
wherein a thickness of the third insulating layer is equal to a thickness of the second circuit pattern,
wherein each of the first and third insulating layers includes a first resin material into which a glass fiber is not impregnated and a filler distributed in the first resin material, and
wherein each of the core and second insulating layers includes a second resin material into which the glass fiber is impregnated and a filler distributed in the second resin material.

2. The printed circuit board of claim 1, wherein the first circuit pattern groove of the first insulating layer is formed through the first insulating layer.

3. The printed circuit board of claim 1, wherein the first via has a sectional shape symmetrical about a central portion of the core insulating layer.

4. The printed circuit board of claim 3, wherein an area of the first via at the central portion of the core insulating layer is smaller than areas of the via at top and bottom surfaces of the core insulation layer.

5. A printed circuit board comprising;
a core insulating layer having a first via hole;
a first via filling the first via hole formed through the core insulating layer;
a first insulating layer on the core insulating layer, the first insulating layer including a first circuit pattern groove;
a first circuit pattern filling the first circuit pattern groove of the first insulating layer;
a second insulating layer on the first insulating layer and having a second via hole;
a second via filling the second via hole formed through the second insulating layer;
a third insulating layer on the second insulating layer, the third insulating layer including a second circuit pattern groove; and
a second circuit pattern filling the second circuit pattern groove of the third insulating layer,
wherein each of the first and third insulating layers includes a first resin material into which a glass fiber is not impregnated and a filler distributed in the first resin material, and
wherein each of the core and second insulating layers includes a second resin material into which the glass fiber is impregnated and a filler distributed in the second resin material.

6. The printed circuit board of claim 5,
wherein a thickness of the first insulating layer is equal to a thickness of the first circuit pattern, and
wherein a thickness of the core insulating layer is equal to a thickness of the first via.

7. The printed circuit board of claim 6,
wherein a thickness of the second insulating layer is equal to a thickness of the second via, and
wherein a thickness of the third insulating layer is equal to a thickness of the second circuit pattern.

8. The printed circuit board of claim 5, wherein the first insulating layer is thinner in thickness than the core insulating layer.

9. The printed circuit board of claim 8, wherein the first via has a sectional shape symmetrical about a central portion of the core insulating layer.

10. The printed circuit board of claim 9, wherein an area of the first via at the central portion of the core insulating layer is smaller than areas of the via at top and bottom surfaces of the core insulation layer.

* * * * *